United States Patent
Melvin, III et al.

(10) Patent No.: US 7,260,812 B2
(45) Date of Patent: Aug. 21, 2007

(54) METHOD AND APPARATUS FOR EXPEDITING CONVERGENCE IN MODEL-BASED OPC

(75) Inventors: Lawrence S. Melvin, III, Hillsboro, OR (US); Benjamin Painter, Tigard, OR (US)

(73) Assignee: Synopsys, Inc, Mountain View, CA (US)

( * ) Notice: Subject to any disclaimer, the term of this patent is extended or adjusted under 35 U.S.C. 154(b) by 250 days.

(21) Appl. No.: 10/910,539

(22) Filed: Aug. 2, 2004

(65) Prior Publication Data

US 2006/0026541 A1    Feb. 2, 2006

(51) Int. Cl.
G06F 17/50 (2006.01)
G03F 1/00 (2006.01)

(52) U.S. Cl. .............. 716/21; 716/20; 430/5
(58) Field of Classification Search .............. 716/21
See application file for complete search history.

(56) References Cited

U.S. PATENT DOCUMENTS

| | | | |
|---|---|---|---|
| 6,221,539 B1 * | 4/2001 | Kotani et al. ................ | 430/5 |
| 6,470,489 B1 * | 10/2002 | Chang et al. ................ | 716/21 |
| 6,510,353 B1 * | 1/2003 | Gudaz et al. ................ | 700/37 |
| 6,653,026 B2 * | 11/2003 | Pierrat et al. ................ | 430/5 |
| 6,813,759 B2 * | 11/2004 | Liu et al. ....................... | 716/21 |
| 6,927,003 B2 * | 8/2005 | Kim et al. ..................... | 430/5 |
| 6,961,186 B2 * | 11/2005 | Pierrat et al. ................ | 359/649 |
| 6,961,636 B1 * | 11/2005 | Chong et al. ................ | 700/121 |
| 7,043,712 B2 * | 5/2006 | Mukherjee et al. ........... | 716/19 |
| 7,132,203 B2 * | 11/2006 | Pierrat ............................ | 430/5 |
| 7,165,234 B2 * | 1/2007 | Pierrat ........................... | 716/21 |

OTHER PUBLICATIONS

Balasinski et al., "Comparison of mask writing tools and mask stimulation for 0.16 μm devices", Sep. 8-10, 1999, ☐☐Advanced Semiconductor Manufacturing Conference and Workshop, IEEE/SEMI, pp. 372-377.*

* cited by examiner

*Primary Examiner*—Jack Chiang
*Assistant Examiner*—Helen Rossoshek
(74) *Attorney, Agent, or Firm*—Park, Vaughan & Fleming LLP; Shun Yao

(57) ABSTRACT

One embodiment of the invention provides a system that expedites or stabilizes convergence in a model-based optical proximity correction (OPC) process. During operation, the system receives a layout for an integrated circuit. Next, the system dissects shapes in the layout into a number of segments, and then runs a number of OPC iterations on the segments to produce an OPC-corrected layout. During each OPC iteration, the system calculates a chrome shift for each segment based on a current layout obtained from the previous iteration, wherein the chrome shift for a segment is measured from the previous position of the chrome edge in that segment. The system then calculates an adjusted chrome shift for each segment based on the newly calculated chrome shift and chrome shift values obtained in one or more previous iterations. Next, the system applies the adjusted chrome shift values to the current layout to obtain an updated layout.

24 Claims, 8 Drawing Sheets

METHOD AND APPARATUS FOR EXPEDITING CONVERGENCE IN MODEL-BASED OPC

BACKGROUND

1. Field of the Invention

This invention relates to the process of designing and fabricating semiconductor chips. More specifically, the invention relates to a method and an apparatus for performing model-based optical proximity correction (OPC), wherein feedback is used to expedite the convergence of the OPC process.

2. Related Art

As integration densities on a semiconductor chip continue to increase at an exponential rate, it is becoming progressively harder to deal with optical effects that arise during the optical lithography process involved in manufacturing the semiconductor chips. These optical effects can cause unwanted distortions in the printed layout that are generated by the optical lithography process.

To remedy this problem, a layout is often subjected to a model-based optical proximity correction (OPC) process, which adjusts the layout to compensate for optical effects. (Although the term "optical proximity correction" is used in this specification, more generally the term as used herein refers to correction for any specified proximity effects, e.g. optical, micro-loading, etch, resist, phase shift mask (PSM), etc.) These adjustments are made based upon results of model-based simulations of the printed layout. During this model-based OPC process, edges in the layout are divided into segments, and each segment is adjusted with a negative or a positive bias based upon a deviation between the desired layout and the simulated layout. The model-based OPC process then re-simulates the layout and measures the deviation of the resulting output pattern from the expected position, and re-adjusts the edge biases based on this deviation.

In a model-based OPC process, a number of iterations of such edge adjustments are necessary for the process to converge on an acceptable result. This is because segments interact with neighboring segments, so adjustments to a given segment can affect the final printed layout for neighboring segments. Furthermore, as pattern features become smaller, different correction areas tend to correct at different rates, and these differing correction rates can cause the OPC process to oscillate. Consequently, convergence to a final solution can require more iterations.

It is important to minimize the number of OPC iterations, because performing a large number of iterations takes a great deal of time, which can greatly increase the cost of generating the output mask pattern. Hence, what is needed is a method and an apparatus for expediting convergence in a model-based OPC process.

SUMMARY

One embodiment of the invention provides a system that expedites or stabilizes convergence in a model-based optical proximity correction (OPC) process. During operation, the system receives a layout for an integrated circuit. Next, the system dissects shapes in the layout into a number of segments, and then runs a number of OPC iterations on the segments to produce an OPC-corrected layout. During each OPC iteration, the system calculates a chrome shift for each segment based on a current layout obtained from the previous iteration, wherein the chrome shift for a segment is measured from the previous position of the chrome edge in that segment. The system then calculates an adjusted chrome shift for each segment based on the newly calculated chrome shift and chrome shift values obtained in one or more previous iterations. Next, the system applies the adjusted chrome shift values to the current layout to obtain an updated layout.

In a variation of this embodiment, calculating the adjusted chrome shift for each segment involves producing a summation of one or more values selected from a proportional feedback value, a derivative feedback value, and an integral feedback value. The proportional feedback value is obtained by multiplying the newly calculated chrome shift by a segment-specific proportional gain P. The derivative feedback value is obtained by multiplying the difference between the newly calculated chrome shift and the chrome shift obtained in the previous iteration by a segment-specific derivative gain D. The integral feedback value is obtained by multiplying the average of chrome shift values obtained in a number of past iterations by a segment-specific integral gain I.

In a further variation, producing the summation involves summing the proportional feedback value, the derivative feedback value, and the integral feedback value.

In a further variation, each iteration further involves clamping the adjusted chrome shift for each segment by limiting the maximum absolute value of the chrome shift to a pre-determined value.

In a further variation, the system stops iterating when the absolute difference between the adjusted chrome shift obtained in the current iteration and the chrome shift obtained in the previous iteration is less than a pre-determined value.

In a further variation, the system stops iterating when the total number of iterations reaches a pre-determined number.

In a further variation, the system uses different P, I, and D values for each type of segment.

In a further variation, the system obtains different P, I, and D values for different segment types based on simulations performed on a test layout containing a variety of segments.

In a further variation, the variation of segments may include: a run segment; a line-end segment; a hammer-head segment; a slot-end segment; an interior corner segment; an exterior corner segment; an interior corner-adjacent segment; an exterior corner-adjacent segment; an interior jog-corner segment; and an exterior jog-corner segment.

DETAILED DESCRIPTION

General IC Design Work Flow

Figure 1:
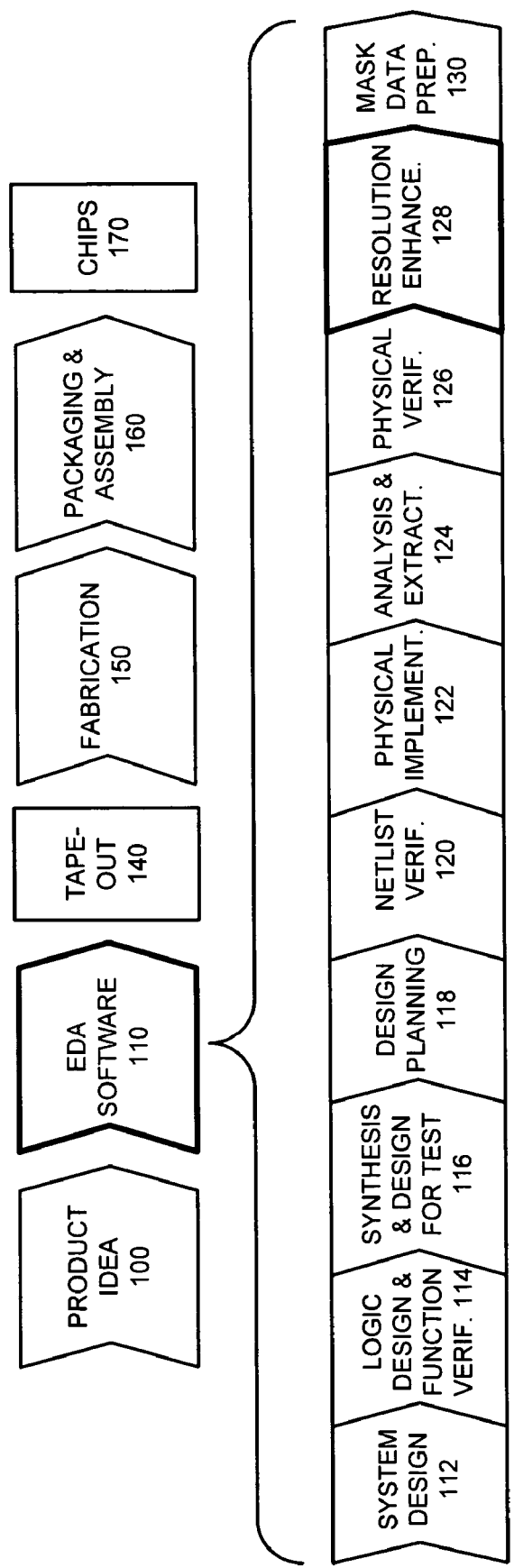
FIG. 1 shows a simplified representation of an exemplary digital application-specific IC (ASIC) design flow.

Before proceeding with the description, it may be helpful to place the OPC process in context. FIG. 1 shows a simplified representation of an exemplary digital application-specific IC (ASIC) design flow. At a high level, the process starts with the product idea (step 100) and is realized in an electronic design automation (EDA) software design process (step 110). When the design is finalized, it can be taped-out (event 140). After tape out, the fabrication process (step 150) and packaging and assembly processes (step 160) occur, resulting in finished chips (result 170).

The EDA software design process (step 110) is actually comprised of a number of steps 112-130, shown in linear fashion for simplicity. In an actual ASIC design process, the particular design might have to go back through steps until certain tests are passed. Similarly, in any actual design process, these steps may occur in different orders and combinations. This description therefore provides a context and general explanation rather than as a specific, or recommended, design flow for a particular ASIC.

The components steps of the EDA software design process (step 110) are as follows:

System design (step 112): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the very-high-speed IC design language (VHDL) or Verilog code for modules in the system is written and the design is checked for functional accuracy. More specifically, one needs to ensure that the design produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog code is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Design planning (step 118): Here, an overall floorplan for the chip is constructed and analyzed for timing and top-level routing. Exemplary EDA software products from Synopsys, Inc. that can be used at this step include Jupiter and Floorplan Compiler products.

Netlist verification (step 120): At this step, the netlist is checked for compliance with timing constraints and for correspondence with the VHDL/Verilog source code. Exemplary EDA software products from Synopsys, Inc. that can be used at this step include VCS, VERA, Formality and PrimeTime products.

Physical implementation (step 122): The placement (positioning of circuit elements) and routing (connection of the same) occurs at this step. Exemplary EDA software products from Synopsys, Inc. that can be used at this step include the Astro product.

Analysis and extraction (step 124): At this step, the circuit function is verified at a transistor level, this in turn permits what-if refinement. Exemplary EDA software products from Synopsys, Inc. that can be used at this step include Star RC/XT, Raphael, and Aurora products.

Physical verification (step 126): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include iN-Phase, Proteus, and AFGen products.

Mask data preparation (step 130): This step provides the "tape-out" data for production of masks for lithographic use to produce finished chips. Exemplary EDA software products from Synopsys, Inc. that can be used at this step include the CATS(R) family of products.

The OPC process occurs during step 128. A layout is first dissected into a number of segments, which capture critical features of the layout, such as lines, corners, and line-ends. Next, the system performs model-based simulation on each segment and its neighbors to predict a pattern that would be generated by this layout. According to the deviation between the predicted pattern and the target pattern, the system then calculates how much the edge between an opaque region and a transparent region in each segment should be moved (also called chrome shift).

Model-based OPC Process

Figure 2A:
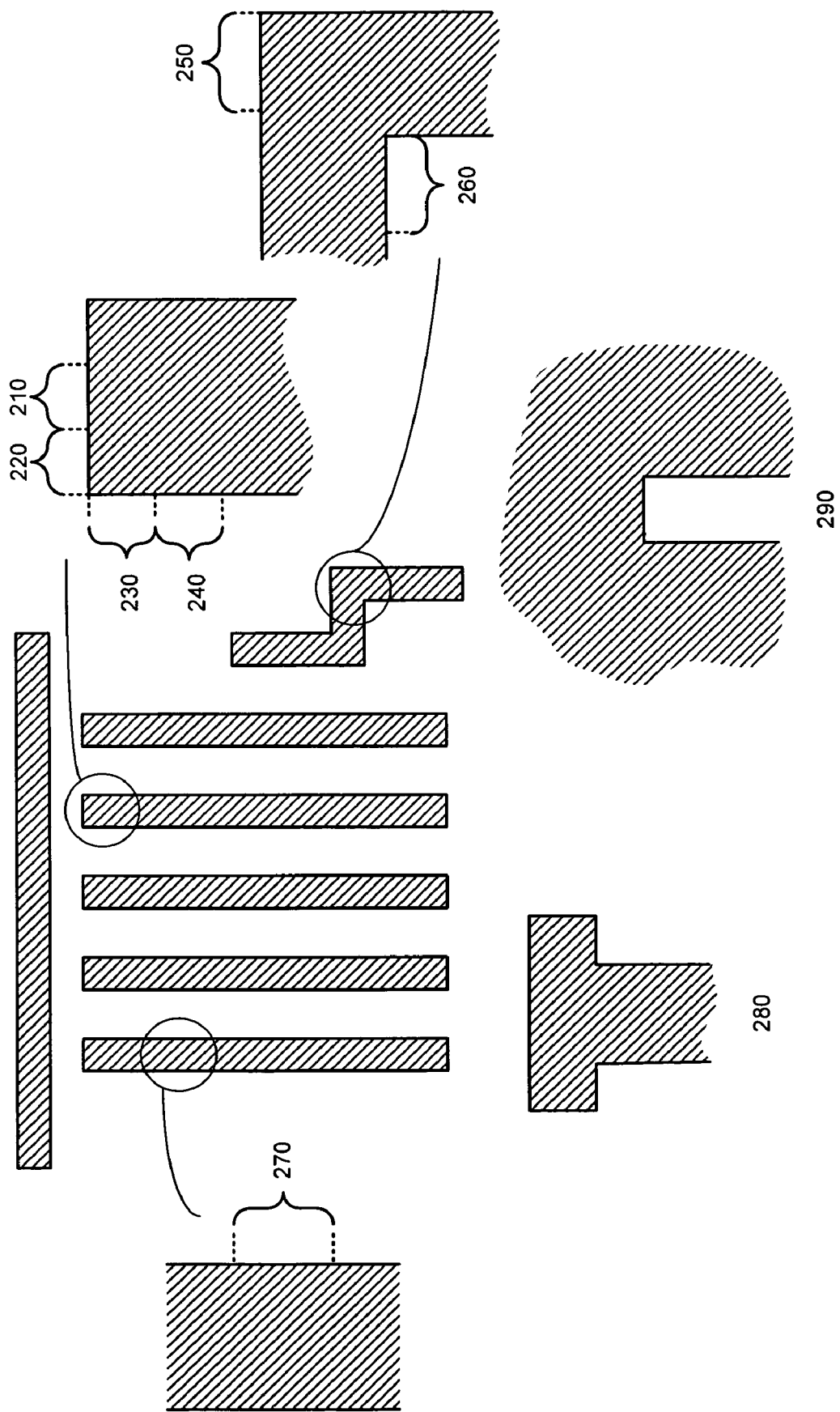
FIG. 2A illustrates representative segments in an exemplary layout.

FIG. 2A illustrates representative segments in an exemplary layout. As mentioned above, in order to correct a pattern, the pattern is first segmented into correction segments during a process called dissection. Dissection allows localized corrections of each segment based on modeled process data. During the dissection process the system chooses segment lengths to maximize correction accuracy while minimizing reticle production costs. Typically, aggressive corrections use 0.25- to 0.35-wavelength segments and more relaxed corrections use 0.4- to 0.8-wavelength segments.

FIG. 2A shows several segments representing different positions, each of which is corrected differently. Segment 210 is a line-end segment. Segment 220 is an exterior corner segment on the line-end side. Segment 230 is an exterior corner segment on the long edge side. Segment 240 is an exterior corner-adjacent segment. Segment 250 is an exterior jog-corner segment. Segment 260 is an interior jog-corner segment. Segment 270 is a one-dimensional run segment. Segment 280 is a hammer-head segment. Segment 290 is a slot-end segment. Note that the example segments shown in FIG. 2A are not exhaustive, and different segments may have different names. It is also possible that more segment types will be created in the future.

Figure 2B:
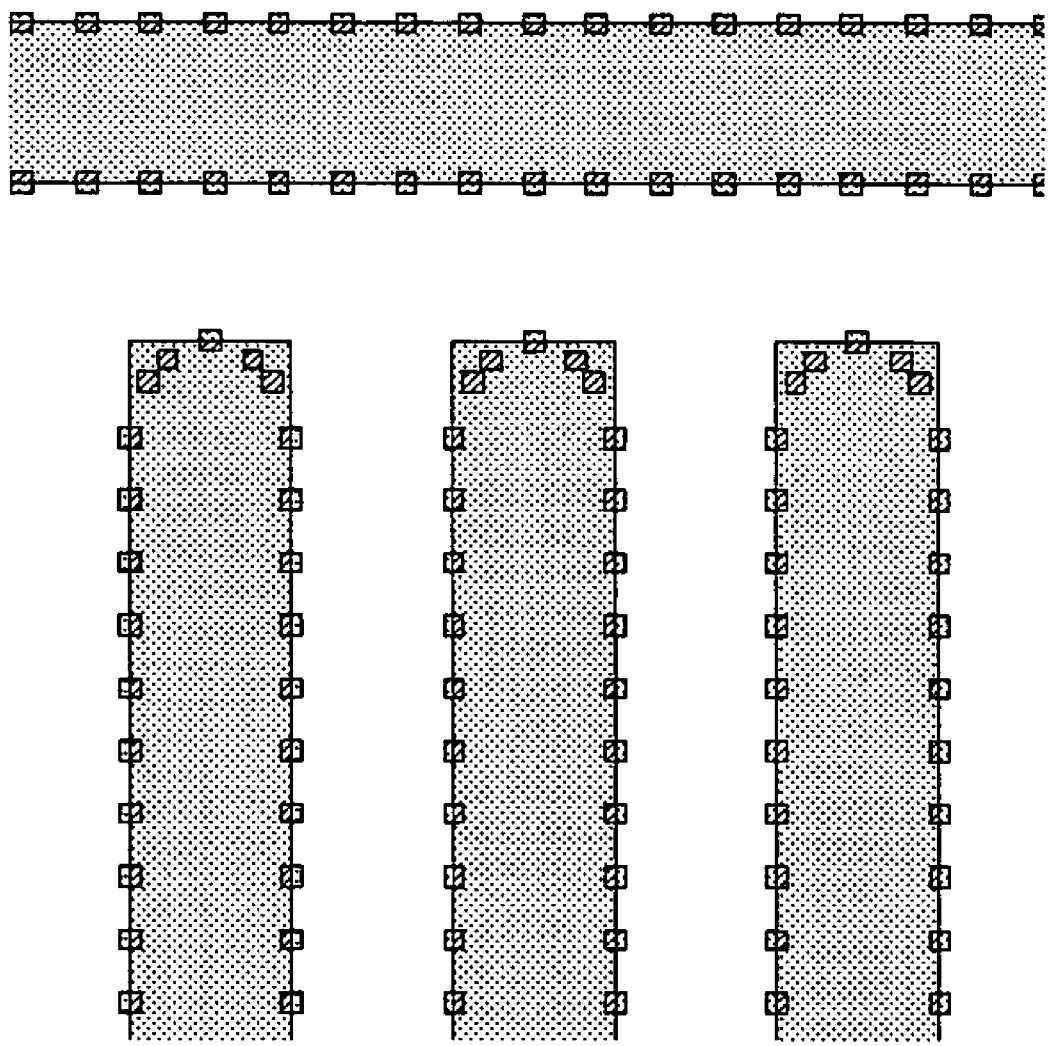
FIG. 2B illustrates the target for a line-end pattern in a layout.

FIG. 2B illustrates the target for a line-end pattern in a layout. Once a pattern is dissected, a realistic target pattern is assigned in a process called "interpretation filtering". Due to optical effects, the contour of the pattern must curve, so the target for the segments is different from the drawn polygon. Thus, the correction goal is redefined to target the correction contour to pass through the center of each of the squares in FIG. 2B.

PID Controller for Expediting OPC Convergence

Figure 3:
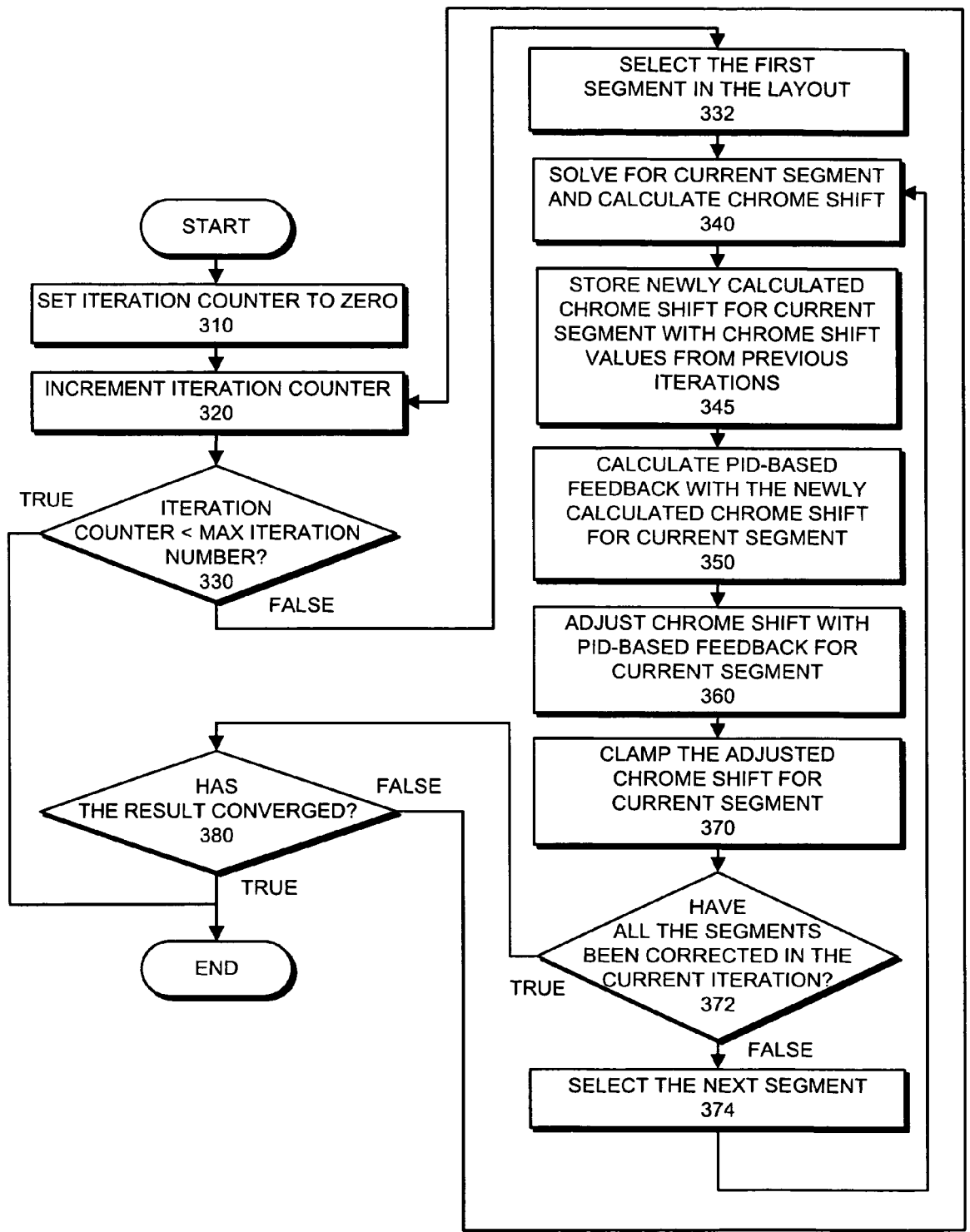
FIG. 3 presents a flow chart illustrating the process of using proportional-integral-derivative feedback control for expediting convergence in an OPC process in accordance with one embodiment of the present invention.

FIG. 3 presents a flow chart illustrating the process of using proportional-integral-derivative feedback control for expediting convergence in an OPC process in accordance with one embodiment of the present invention. An OPC process typically involves a number of iterations. During each iteration, the process performs the following correction for each segment. The process first simulates a segment in the current version of layout to predict the pattern that would be generated by this layout. Based on the deviation between the predicted pattern and the target pattern, the process computes a chrome shift for this segment. Next, the process performs a check to ensure that the chrome shift does not exceed a pre-determined value, and if so, the chrome shift value is reduced to be within that pre-determined value (called "clamping"). After clamping, a new chrome shift value for the segment is produced, which feeds into the next iteration. The process performs correction for every segment in the layout before entering the next iteration.

The OPC process stops when the difference between results from two consecutive iterations is less than a pre-specified small value. Alternatively, a user can set a maximum number of iterations after which the process stops.

Fast convergence of the results is crucial during an OPC process, because it directly influences the cost of designing a chip. This invention uses a proportional-integral-derivative (PID) controller to expedite convergence. A PID controller is a well-known control tool that uses proportional, integral, and derivative functions to rapidly bring a system to stability and convergence. The present invention uses a PID controller to minimize changes in chrome over each iteration. Note that the PID controller not only expedites the convergence, but also makes unstable systems stable. This allows the correction to converge to a stable final solution. In the absence of a stable solution, the alternative is to stop the correction at an intermediate state, a process that can result in suboptimal corrections. In addition, targeting is not always necessary when a PID controller is used. Targeting may also be coupled into the PID parameter determination process.

In one embodiment of the present invention, the calculated chrome shift of a segment is adjusted based on PID feedback, which is comprised of a proportional error, an integral error, and a derivative error. The proportional error is a constant multiplied by the correction error. The integral error is the sum of error over time. The derivative error is the difference in error over time. The PID feedback for the jth segment during the kth iteration can be calculated according to the following equation:

$$\text{error\_out}_k = P_j \times \text{error}_k + D_j \times \frac{\Delta \text{error}_k}{\Delta k} + I_j \times \frac{1}{n} \times \sum_{i=k-n}^{k} \text{error}_i$$

where error_out$_k$ is the adjusted chrome shift in the kth iteration;

$P_j$ is the proportional gain for the jth segment;

error$_k$ is the calculated, pre-adjustment chrome shift obtained from simulation in the kth iteration;

$D_j$ is the derivative gain for the jth segment;

$\Delta$error$_k$ is the difference between the chrome shift obtained in the kth and (k−1)th iterations;

$\Delta k$ is the time unit (time interval), which is one is this case;

$I_j$ is the integral gain for the jth segment; and n is the number of past chrome shift values obtained in previous iterations (including the present chrome shift value, error$_k$) that are integrated over time.

After adjusting the segment's chrome shift based on the PID feedback, the process performs clamping to ensure that the adjusted chrome shift values stay within the pre-determined limits.

The flowchart in FIG. 3 illustrates this process. The system starts by setting an iteration counter to zero (step 310), and increments the counter by one for the current iteration (step 320). The system then checks whether the counter value has reached the maximum iteration number (step 330). If so, the system stops iterating and exits. If not, the system proceeds to simulate the current layout and calculates the corresponding chrome shift for each segment. Note that in the first iteration, the system may use a layout provided by the user.

To calculate chrome shift for each segment, the system starts by selecting the first segment in the layout (step 332). The system then solves for the current segment and calculates the segment's chrome shift based (step 340). Next, the system stores the newly calculated chrome shift value in a storage structure associated with the current segment (step 345) (For example, this storage structure can be a first-in-first-out queue structure holding n sets of results, where in each iteration the oldest set of results is deleted and the newly calculated set of results is stored.) The system then uses the past chrome shift values for the same segment to calculate a PID feedback (step 350), and produces an adjusted chrome shift based on the PID feedback (step 360). Next, the system performs clamping to ensure that the adjusted chrome shift values are within pre-specified limits (step 370). The system then determines whether all the segments have been corrected in the current iteration (step 372). If not, the system selects the next segment (step 374), and repeats the calculation again for the next segment.

If all segments have been corrected in the current iteration, the system then decides whether the results have converged by comparing the adjusted chrome shift values with those obtained from the previous iteration (step 380). Generally, convergence occurs when the absolute value of the difference is less than a pre-specified small value (convergence tolerance). If the results have converged, the system stops iterating. If not, the system proceeds with the next iteration by going back to step 320.

Note that several parameters can be used to create an effective PID controller. The gains $P_j$, $I_j$, and $D_j$ are used to control stability, correction speed (number of iterations), and accuracy. The values of $P_j$, $I_j$, and $D_j$ vary by segment type. They can be stored in user-defined segment arrays and can be populated through a look up table prior to correction. In addition, a global tolerance value may be used to control the convergence. When every segment's chrome shift is less than this global tolerance value, the results are considered to have converged. For example, a typical tolerance value for a 90 nm process can be set at 0.25 nm.

A set of properly chosen PID parameters can improve convergence speed. One can choose proper PID gain values by running the OPC process on a test layout with different pattern features (e.g., isolated, nested, 1-D, and 2-D features). By running the OPC process on a number of representative segments and adjusting the parameters to determine values that optimize the segment's convergence rate, one can select proper PID gains for each type of segment.

Figure 4:
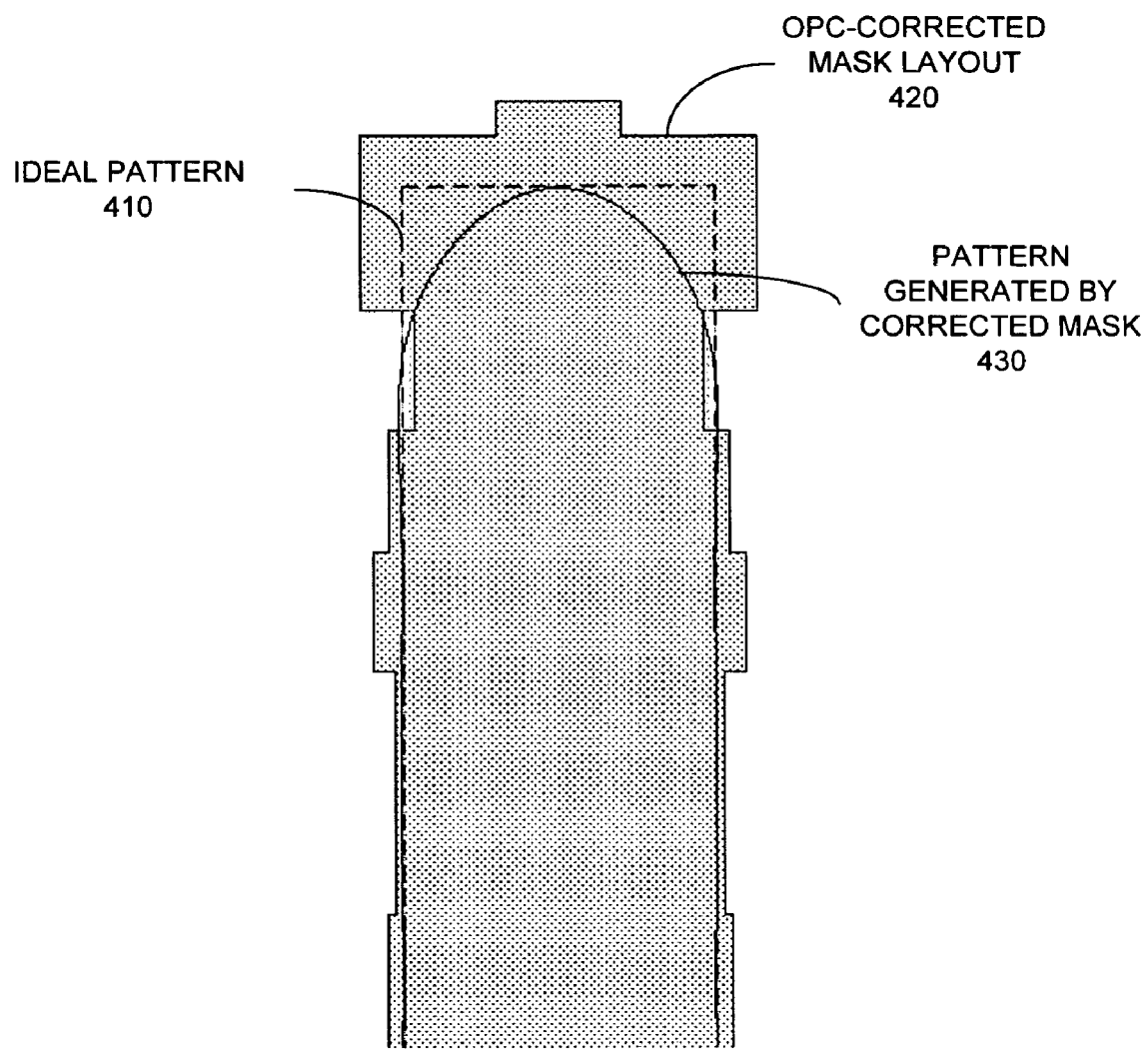
FIG. 4 illustrates the converged correction result of a line-end pattern obtained by the PID controller in accordance to one embodiment of the present invention.

FIG. 4 illustrates the converged correction result of a line-end shape obtained by the PID controller in accordance to one embodiment of the present invention. Shape 410 is the ideal shape, which is a polygon. Shape 420 is the OPC-corrected mask layout obtained using the PID controller. Shape 430 is the simulated pattern which would result from mask layout 420. (Note that shape 430 also overlaps the target shape.)

Figure 5A:
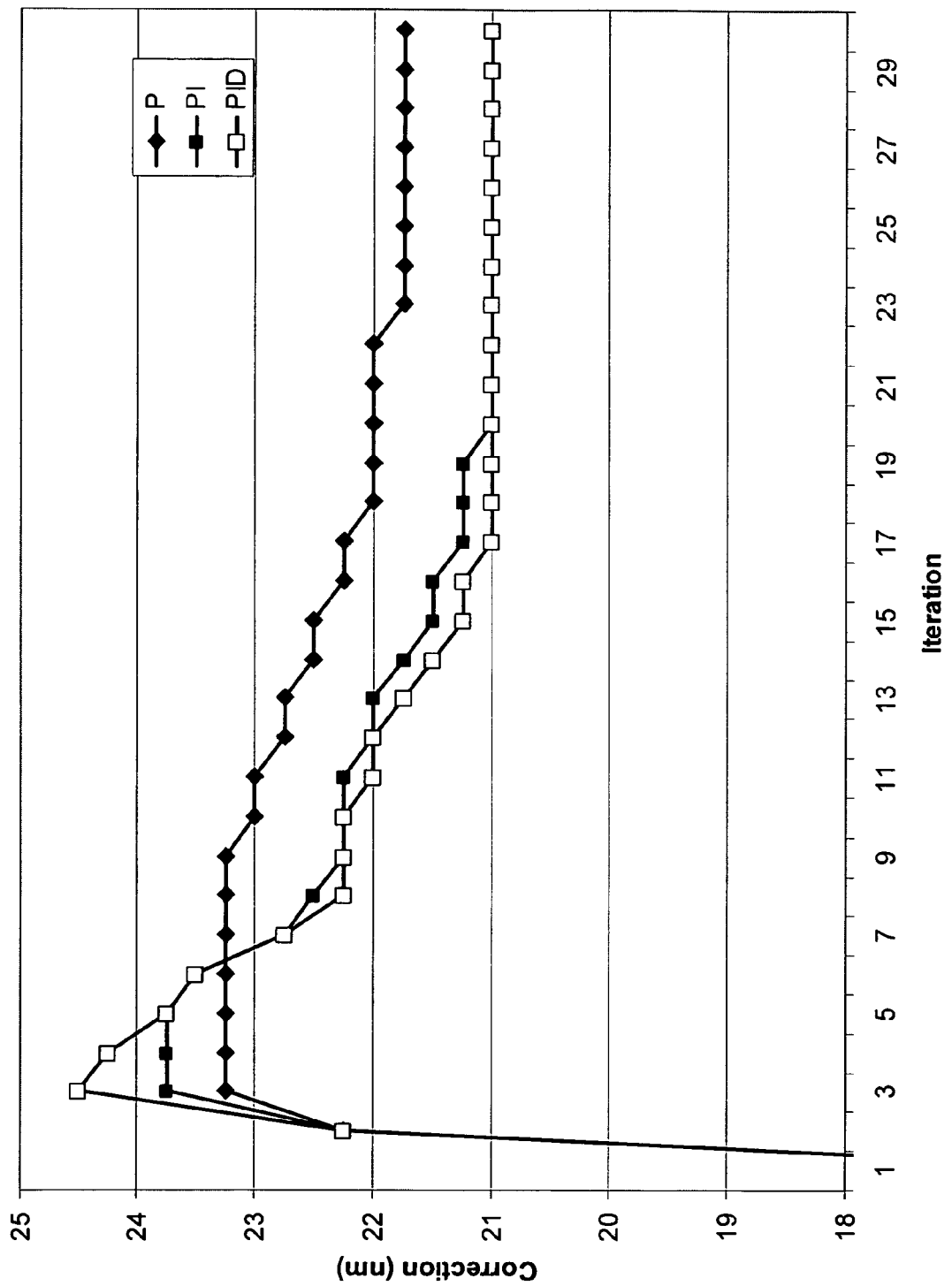
FIG. 5A presents a comparison of convergence speed of the PID controller for segment type 230 of an exemplary layout in accordance with one embodiment of the present invention.
Figure 5B:
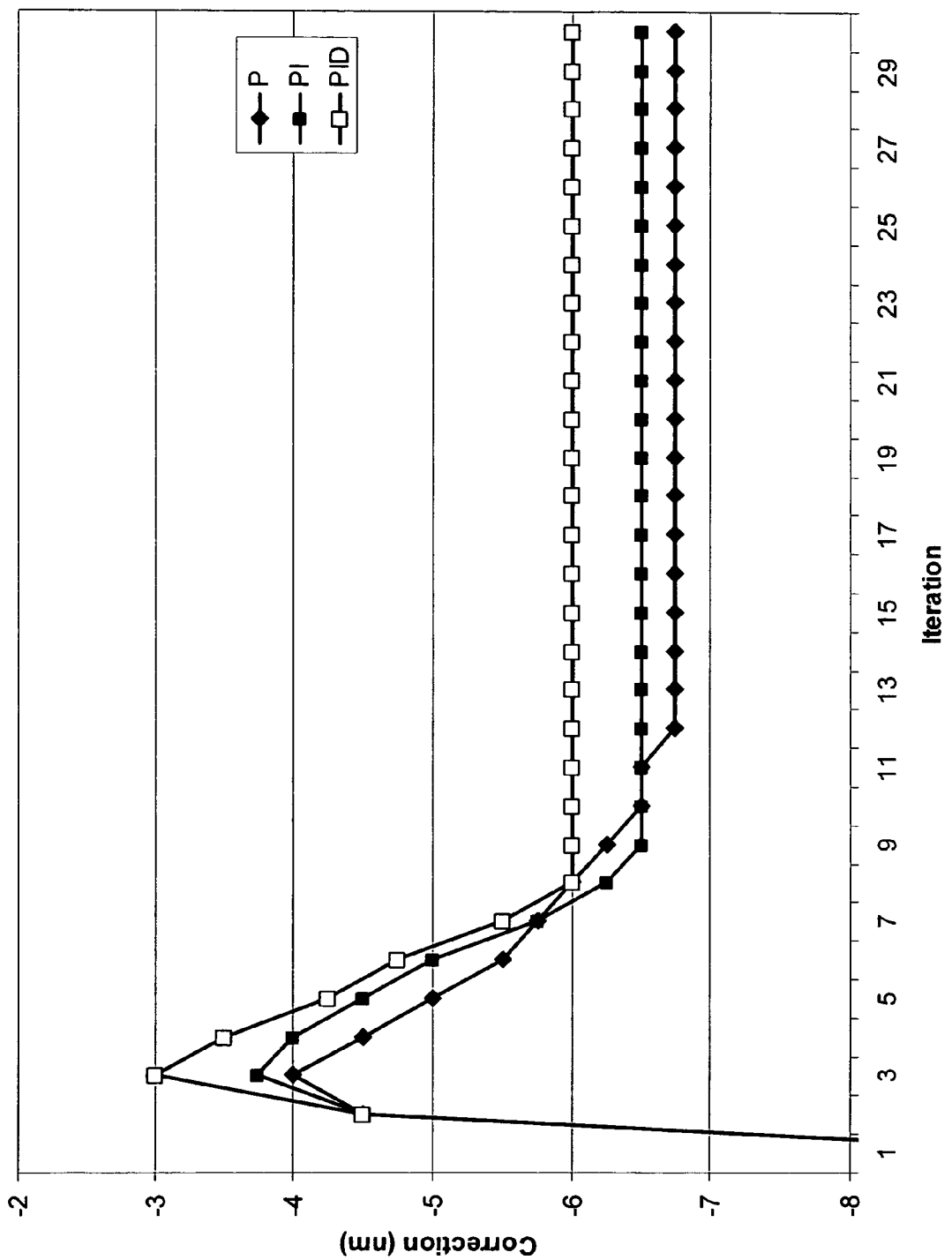
FIG. 5B presents a comparison of convergence speed of the PID controller for segment type 240 of an exemplary layout in accordance with one embodiment of the present invention.

FIG. 5A presents a comparison of convergence speed of the PID controller for segment type 230 of an exemplary layout in accordance with one embodiment of the present invention. Similarly, FIG. 5B presents a comparison of convergence speed of the PID controller for segment type 240 of an exemplary layout in accordance with one embodiment of the present invention. An experimental OPC process is performed on a layout similar to that of FIG. 2. In this example, a pattern is considered to have converged if it is stable and does not change by more than 0.25 nm from a previous iteration at which all segments are stable. For comparison purposes, the figures include the plots of an OPC process based on only proportional feedback (denoted as "P" in the figures) and that based on proportional and integral feedback (denoted as "PI" in the figures). The plot of PID controller is denoted as "PID" in the figures. From the examples in FIGS. 5A and 5B, one observes that in general, the proportionally controlled system takes the largest number of iterations to reach stability, and the PID system takes the fewest.

Figure 6:
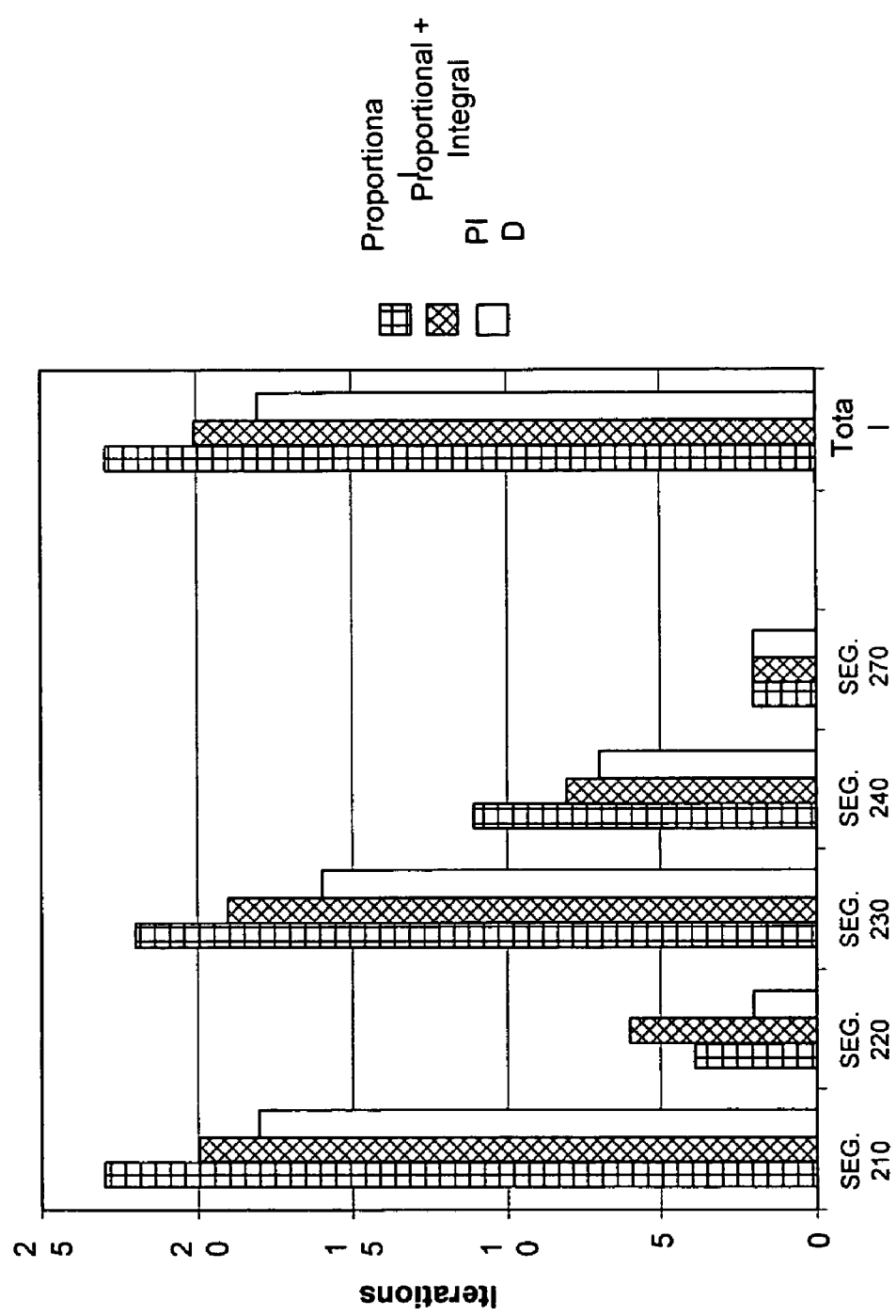
FIG. 6 illustrates the convergence time of various segments obtained using the PID controller in accordance with one embodiment of the present invention.

FIG. 6 illustrates the convergence time of various segments obtained using the PID controller in accordance with one embodiment of the present invention. In general, a system controlled with the PID algorithm takes fewer iterations than a system applying traditional proportional control. For the example studied, the overall number of iterations needed decreases from 23 to 18, a reduction of approximately 20%. Thus, when tuned correctly, the PID controller improves overall correction times.

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In some embodiments, the electromagnetic wave form includes one or more of the Proteus™ and iN-Tandem™ software programs, both from Synopsys, Inc., Mountain View, Calif.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

Moreover, note that the invention is not restricted to specific types of OPC, but can be generally applied to features related to a number of different correction or enhancement techniques, such as techniques that use phase shifting masks (PSM).

What is claimed is:

1. A method for expediting or stabilizing convergence in a model-based optical proximity correction (OPC) process, comprising:
   receiving a layout for an integrated circuit;
   dissecting shapes in the layout into a number of segments; and
   running a number of OPC iterations on the segments to produce an OPC-corrected layout, wherein each OPC iteration involves:
      calculating a chrome shift for each segment based on a current layout obtained from the previous iteration, wherein the chrome shift is how far an edge between an opaque region and a transparent region in each segment should be moved, wherein the chrome shift for a segment is measured from the previous position of the chrome edge in that segment, and wherein the chrome shift indicates the difference between the layouts at two consecutive iterations;
      calculating an adjusted chrome shift for each segment based on the newly calculated chrome shift and chrome shift values obtained in one or more previous iterations, wherein each iteration further involves clamping the adjusted chrome shift for each segment by limiting the maximum absolute value of the chrome shift to a pre-determined value; and
      applying the adjusted chrome shift values to the current layout to obtain an updated layout.

2. The method of claim 1, wherein calculating the adjusted chrome shift for each segment involves producing a summation of one or more values selected from a proportional feedback value, a derivative feedback value, and an integral feedback value;
   wherein the proportional feedback value is obtained by multiplying the newly calculated chrome shift by a segment-specific proportional gain P;
   wherein the derivative feedback value is obtained by multiplying the difference between the newly calculated chrome shift and the chrome shift obtained in the previous iteration by a segment-specific derivative gain D; and
   wherein the integral feedback value is obtained by multiplying the average of chrome shift values obtained in a number of past iterations by a segment specific integral gain I.

3. The method of claim 2, wherein producing the summation involves summing the proportional feedback value, the derivative feedback value, and the integral feedback value.

4. The method of claim 3, further comprising stopping the iteration when the absolute difference between the adjusted chrome shift obtained in the current iteration and the chrome shift obtained in the previous iteration is less than a pre-determined value.

5. The method of claim 3, further comprising stopping the iteration when the total number of iterations reaches a pre-determined number.

6. The method of claim 3, further comprising using different P, I, and D values for each type of segment.

7. The method of claim 6, further comprising obtaining different P, I, and D values for different segment types based on simulations performed on a test layout containing a variety of segments.

8. The method of claim 7, wherein the variety of segments include:
   a run segment;
   a line-end segment;
   a hammer-head segment;
   a slot-end segment;
   an interior corner segment;
   an exterior corner segment;
   an interior corner-adjacent segment;
   an exterior corner-adjacent segment;
   an interior jog-corner segment; and
   an exterior jog-corner segment.

9. A computer-readable storage medium storing instructions that when executed by a computer cause the computer to perform a method for expediting or stabilizing convergence in a model-based optical proximity correction (OPC) process, the method comprising:
   receiving a layout for an integrated circuit;
   dissecting shapes in the layout into a number of segments; and
   running a number of OPC iterations on the segments to produce an OPC-corrected layout, wherein each OPC iteration involves:
      calculating a chrome shift for each segment based on a current layout obtained from the previous iteration, wherein the chrome shift is how far an edge between an opaque region and a transparent region in each segment should be moved, wherein the chrome shift for a segment is measured from the previous position of the chrome edge in that segment, and wherein the chrome shift indicates the difference between the layouts at two consecutive iterations;
      calculating an adjusted chrome shift for each segment based on the newly calculated chrome shift and chrome shift values obtained in one or more previous iterations, wherein each iteration further involves clamping the adjusted chrome shift for each segment by limiting the maximum absolute value of the chrome shift to a pre-determined value; and
      applying the adjusted chrome shift values to the current layout to obtain an updated layout.

10. The computer-readable storage medium of claim 9, wherein calculating the adjusted chrome shift for each segment involves producing a summation of one or more values selected from a proportional feedback value, a derivative feedback value, and an integral feedback value;
   wherein the proportional feedback value is obtained by multiplying the newly calculated chrome shift by a segment-specific proportional gain P;
   wherein the derivative feedback value is obtained by multiplying the difference between the newly calculated chrome shift and the chrome shift obtained in the previous iteration by a segment-specific derivative gain D; and
   wherein the integral feedback value is obtained by multiplying the average of chrome shift values obtained in a number of past iterations by a segment specific integral gain I.

11. The computer-readable storage medium of claim 10, wherein producing the summation involves summing the proportional feedback value, the derivative feedback value, and the integral feedback value.

12. The computer-readable storage medium of claim 11, the method further comprising stopping iterating when the absolute difference between the adjusted chrome shift obtained in the current iteration and the chrome shift obtained in the previous iteration is less than a pre-determined value.

13. The computer-readable storage medium of claim 11, the method further comprising stopping iterating when the total number of iterations reaches a pre-determined number.

14. The computer-readable storage medium of claim 11, the method further comprising using different P, I, and D values for each type of segment.

15. The computer-readable storage medium of claim 14, the method further comprising obtaining different P, I, and D values for different segment types based on simulations performed on a test layout containing a variety of segments.

16. The computer-readable storage medium of claim 15, wherein the variety of segments may include:
   a run segment;
   a line-end segment;
   a hammer-head segment;
   a slot-end segment;
   an interior corner segment;
   an exterior corner segment;
   an interior corner-adjacent segment;
   an exterior corner-adjacent segment;
   an interior jog-corner segment; and
   an exterior jog-corner segment.

17. An apparatus that expedites or stabilizes convergence in a model-based optical proximity correction (OPC) process, comprising:
   a receiving mechanism configured to receive a layout for an integrated circuit;
   a segmentation mechanism configured to dissect shapes in the layout into a number of segments; and
   a correction mechanism configured to run a number of OPC iterations on the segments to produce an OPC-corrected layout, wherein during each OPC iteration the correction mechanism is configured to:
      calculate a chrome shift for each segment based on a current layout obtained from the previous iteration, wherein the chrome shift is how far an edge between an opaque region and a transparent region in each segment should be moved, wherein the chrome shift for a segment is measured from the previous position of the chrome edge in that segment, and wherein the chrome shift indicates the difference between the layouts at two consecutive iterations;
      calculate an adjusted chrome shift for each segment based on the newly calculated chrome shift and chrome shift values obtained in one or more previous iterations, wherein each iteration further involves clamping the adjusted chrome shift for each segment by limiting the maximum absolute value of the chrome shift to a pre-determined value; and to
      apply the adjusted chrome shift values to the current layout to obtain an updated layout.

18. The apparatus of claim 17, wherein while calculating the adjusted chrome shift for each segment, the correction mechanism is configured to produce a summation of one or more values selected from a proportional feedback value, a derivative feedback value, and an integral feedback value;
- wherein the proportional feedback value is obtained by multiplying the newly calculated chrome shift by a segment-specific proportional gain P;
- wherein the derivative feedback value is obtained by multiplying the difference between the newly calculated chrome shift and the chrome shift obtained in the previous iteration by a segment-specific derivative gain D; and
- wherein the integral feedback value is obtained by multiplying the average of chrome shift values obtained in a number of past iterations by a segment-specific integral gain I.

19. The apparatus of claim 18, wherein while producing the summation, the correction mechanism is configured to sum the proportional feedback value, the derivative feedback value, and the integral feedback value.

20. The apparatus of claim 19, wherein the correction mechanism is configured to stop iterating when the absolute difference between the adjusted chrome shift obtained in the current iteration and the chrome shift obtained in the previous iteration is less than a pre-determined value.

21. The apparatus of claim 19, wherein the correction mechanism is configured to stop the iterating when the total number of iterations reaches a pre-determined number.

22. The apparatus of claim 19, wherein the correction mechanism is configured to use different P, I, and D values for each type of segment.

23. The apparatus of claim 22, further comprising a selection mechanism that allows a user to obtain different P, I, and D values for different segment types based on simulations performed on a test layout containing a variety of segments.

24. The apparatus of claim 23, wherein the variety of segments include:
- a run segment;
- a line-end segment;
- a hammer-head segment;
- a slot-end segment;
- an interior corner segment;
- an exterior corner segment;
- an interior corner-adjacent segment;
- an exterior corner-adjacent segment;
- an interior jog-corner segment; and
- an exterior jog-corner segment.

* * * * *